(12) United States Patent
Lutz et al.

(10) Patent No.: US 6,771,086 B2
(45) Date of Patent: Aug. 3, 2004

(54) SEMICONDUCTOR WAFER ELECTRICAL TESTING WITH A MOBILE CHILLER PLATE FOR RAPID AND PRECISE TEST TEMPERATURE CONTROL

(75) Inventors: Robert C. Lutz, Sunnyvale, CA (US); Lloyd B. Dickson, Sunnyvale, CA (US); Ralph James Eddington, Newman, CA (US)

(73) Assignee: Lucas/Signatone Corporation, Gilroy, CA (US)

( * ) Notice: Subject to any disclaimer, the term of this patent is extended or adjusted under 35 U.S.C. 154(b) by 172 days.

(21) Appl. No.: 10/079,329

(22) Filed: Feb. 19, 2002

(65) Prior Publication Data

US 2003/0155939 A1 Aug. 21, 2003

(51) Int. Cl.[7] .............................. G01R 31/02; F28F 7/00
(52) U.S. Cl. ...................................... 324/760; 165/80.2
(58) Field of Search ................................ 324/754, 760, 324/765; 118/712; 432/81, 120–122, 137, 152, 197; 266/87–88; 165/80.2–80.5

(56) References Cited

U.S. PATENT DOCUMENTS

| | | | |
|---|---|---|---|
| 4,609,037 A | | 9/1986 | Wheeler et al. |
| 4,784,213 A | | 11/1988 | Eager et al. |
| 5,885,353 A | * | 3/1999 | Strodtbeck et al. .......... 118/712 |
| 6,073,681 A | | 6/2000 | Getchel et al. |
| 6,313,649 B2 | | 11/2001 | Harwood et al. |
| 6,394,797 B1 | * | 5/2002 | Sugaya et al. .............. 432/253 |
| 6,471,913 B1 | * | 10/2002 | Weaver et al. .............. 266/256 |

* cited by examiner

Primary Examiner—Ernest Karlsen
Assistant Examiner—Russell M. Kobert
(74) Attorney, Agent, or Firm—Law Offices of Thomas E. Schatzel

(57) ABSTRACT

A semiconductor-wafer chuck for heating and cooling a device-under-test includes a heat-spreader plate with a clamping surface for a semiconductor wafer. A heater is disposed within the heat-spreader plate. A chiller heat-exchanger provides for heat removal. A motion control system is used to move the chiller heat-exchanger in relation to the heat-spreader plate, and thus provide for an adjustment of the thermal resistance and thermal coupling between the two. The heater comprises electric heating elements with a variable power input, and the chiller heat-exchanger is moved sufficiently far away to prevent boiling and evaporation of a coolant disposed inside. A device-under-test temperature controller controls the device-under-test temperature by adjusting the heater power, chiller fluid temperature and/or by moving the chiller heat-exchanger in relation to the heat spreader plate.

11 Claims, 7 Drawing Sheets

SEMICONDUCTOR WAFER ELECTRICAL TESTING WITH A MOBILE CHILLER PLATE FOR RAPID AND PRECISE TEST TEMPERATURE CONTROL

1. FIELD OF THE INVENTION

The present invention relates to methods and devices for cycling the temperature of a device-under-test, and more particularly to chuck systems for semiconductor wafers that provide for rapidly obtained set-point temperatures over a wide control range.

2. DESCRIPTION OF THE PRIOR ART

Thermal testing systems used in the semiconductor industry have advanced to the point that wide temperature variations for device testing can be induced in semiconductor wafers. For example, Temptronic Corporation (Sharon, Mass.) markets a thermal test system called THERMO-CHUCK®. This thermal inducing vacuum platform allows for wafer probing, testing, and failure analysis at precise, controlled temperatures. Wafers as big as 300-mm in diameter can be accommodated and temperature controlled with a range of −65° C. to +400° C.

A modern wafer probing system is described by Warren Harwood, et al., in U.S. Pat. No. 6,313,649 B2, issued Nov. 6, 2001, and titled WAFER PROBE STATION HAVING ENVIRONMENT CONTROL ENCLOSURE. A positioning mechanism is included to facilitate microscopic probing.

Operating temperatures over +200° C. and certainly those as high as +400° C. resulted in a prior art requirement to valve cooling air and liquid coolant between high temperature and low temperature evaporators. One such arrangement is described by George Eager, et al., in U.S. Pat. No. 4,784,213, issued Nov. 15, 1988, and titled MIXING VALVE AIR SOURCE.

Typical device-under-test chucks used for probing semiconductor wafers have a flat plate with holes in it so the semiconductor wafer can be drawn tightly down with a vacuum. For example, see U.S. Pat. No. 6,073,681, issued to Paul A. Getchel, et al., on Jun. 13, 2000, for a WORKPIECE CHUCK. The flat plate usually has an electric heater and a chiller heat-exchanger for heating and cooling the device-under-test. A fluorocarbon liquid is pumped from an external chiller through the chiller heat-exchanger to bring the temperature down below −65° C. The electric heating elements can raise the device-under-test temperature as high as +400° C. Thermocouples are used to measure the chuck temperature and provide feedback to a closed-loop control system with a temperature setpoint manipulated by a user.

William Wheeler describes a hot/cold chuck in U.S. Pat. No. 4,609,037, issued Sep. 2, 1986. An electric heater is used in a top plate and a coolant circulating plate below it is brought in contact during the cooling phase. A power and control system for such a device-under-test chuck is described in U.S. Pat. No. 6,091,060, issued Jul. 18, 2000, to Getchel, et al.

Unfortunately, the fluorocarbon liquid pumped from the external chiller through the chiller heat-exchanger is subject to boiling and evaporation loss when the electric heaters are used. Such fluorocarbon liquids are very expensive, and even a teaspoonful loss every temperature cycle can add up to thousands of dollars of expense over a relatively short time.

SUMMARY OF THE INVENTION

It is therefore an object of the present invention to provide a method for rapidly heating and cooling a device-under-test.

It is another object of the present invention to provide a vacuum chuck system that is simple and inexpensive to manufacture and operate.

Briefly, a semiconductor-wafer chuck embodiment of the present invention provides for heating and cooling of a device-under-test. It includes a heat-spreader plate with a clamping surface for a semiconductor wafer. A heater is disposed within the heat-spreader plate and provides for temperature elevations. A chiller heat-exchanger independent of the heat-spreader plate provides for heat removal. A position control system is used to move the chiller heat-exchanger in relation to the heat-spreader plate, and thus provide for an adjustment of the thermal resistance and thermal coupling between the two. The heater typically comprises electric heating elements with a controlled power input including full on and off, and the chiller heat-exchanger is moved sufficiently far enough away to prevent boiling and evaporation of a coolant disposed inside when the heater is switched on. A device-under-test-temperature controller has outputs connected to the heater and the position control system, and an input for sensing the temperature of a device-under-test clamped to the heat-spreader plate. It then can control the device-under-test temperature by controlling the heater power, and/or by moving the chiller heat-exchanger in relation to the heat-spreader plate.

An advantage of the present invention is that a method is provided for rapid heating and cooling of devices-under-test.

Another advantage of the present invention is that a hot/cold vacuum chuck system is provided that does not boil off and evaporate coolant, and therefore is inexpensive to operate.

A further advantage of the present invention is that a hot/cold chuck system is provided that avoids the use of complex valving systems for coolant circulation and control, and therefore is less expensive to manufacture.

Another advantage of the present invention is that a hot/cold chuck system is provided that does not depend on valves to route coolant and cool-down air.

A still further advantage of the present invention is that a hot/cold chuck system is provided that does not need to expel vapor, fumes or gases too hot for plastic pipes and pieces to be used.

These and other objects and advantages of the present invention will no doubt become obvious to those of ordinary skill in the art after having read the following detailed description of the preferred embodiments which are illustrated in the various drawing figures.

IN THE DRAWINGS

FIG. 3A shows the cooling heat-exchanger close to the top of its travel, and FIG. 3B shows it close to its bottom travel limit;

DETAILED DESCRIPTION OF THE PREFERRED EMBODIMENT

Figure 1:
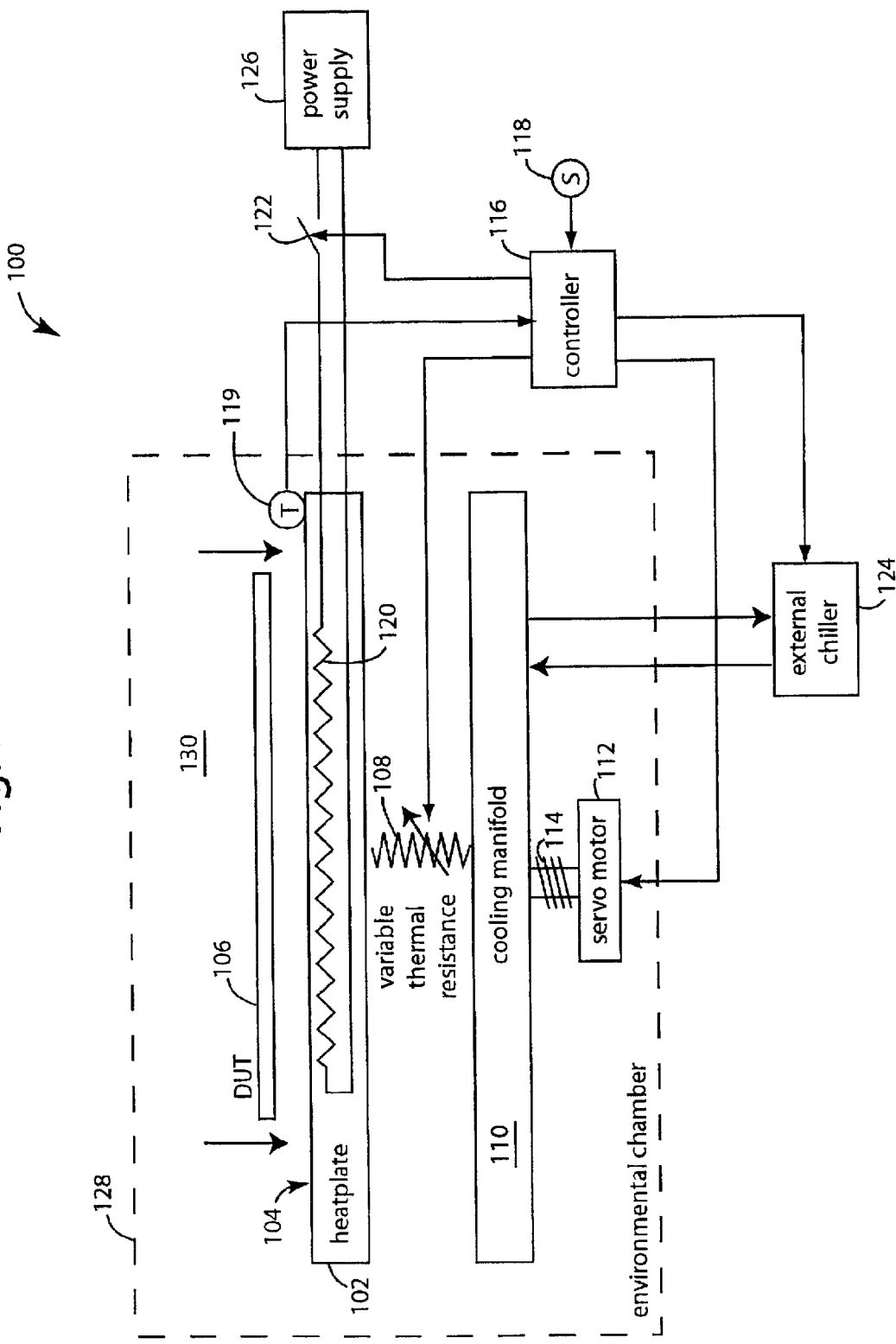
FIG. 1 is a schematic diagram of a device-under-test heating-and-cooling embodiment of the present invention.

FIG. 1 illustrates a device-under-test chuck heating-and-cooling method embodiment of the present invention, and is referred to herein by the general reference numeral 100. Embodiments other than this one are more preferred in many applications. However, this embodiment provides a good vehicle here to discuss the principle critical components and methods used in all embodiments.

The method 100 provides a heat-spreader plate 102 with a clamping surface 104 for a device-under-test 106. The device-under-test 106 is typically a semiconductor wafer device-under-test that is heated and cooled to various set-point temperatures for probing and failure analysis. The method 100 includes allowing the rapid heating of the heat-spreader plate 102 by increasing a variable thermal resistance, represented by schematic symbol 108, to a chiller heat-exchanger 110. The heat-spreader plate 102, and therefore the device-under-test 106, are cooled by decreasing the thermal resistance 108 and thus increasing the thermal coupling to the chiller heat-exchanger 110.

The thermal resistance 108 is not a physical part, it represents the effect of moving the chiller heat-exchanger 110 relative to the heat-spreader plate 102.

The heat-spreader plate 102 unavoidably has a thermal mass that can slow down temperature ramping. However, in order to spread heat well, it must be constructed of metal and metal will have a significant thermal mass. What is important is the ratio of the thermal masses of the heat spreader and the chiller heat-exchanger. When the chiller heat-exchanger has a large thermal mass relative to the spreader, the temperature increase it experiences when brought into to contact with a hotter spreader plate is reduced, easing fluid overheating problems.

One way to increase the thermal resistance 108 is accomplished by increasing a separation distance between the heat-spreader plate 102 and the chiller heat-exchanger 110. This would lengthen the path heat would have to travel over the thermally inefficient air gap. Alternatively, the step of heating comprises increasing the thermal resistance by introducing a lesser thermally conductive intervening medium between the heat-spreader plate and the chiller heat-exchanger, e.g., a vacuum.

The step of cooling comprises decreasing the thermal resistance by decreasing a separation distance between the heat-spreader plate 102 and the chiller heat-exchanger 110. Alternatively, the step of cooling comprises decreasing the thermal resistance by introducing a more thermally conductive intervening medium between the heat-spreader plate and the chiller heat-exchanger, e.g., a dense gas or liquid.

A positioning motor 112 with a leadscrew or jackscrew 114 can be used to position the chiller heat-exchanger 110 closer to or farther from the heat-spreader plate 102. At the minimum thermal resistance 108, the heat-spreader plate 102 may be in full face contact with the chiller heat-exchanger 110. A useful maximum separation was discovered to be only a scant 0.30 inches. A positioning controller 116 can be used to control the effective thermal resistance 108. A setpoint temperature (S) 118 is compared to a device-under-test temperature (T) 119 and the difference causes control signals to be developed for an electric heater 120 via heater controller 116 and an external chiller 124. An electric power source 126 supplies operating current to the heater 120. The heater is operated after the heat-spreader plate 102 and chiller heat-exchanger 110 are separated, and then the external chiller 124 is idled. A typical idle temperature for the chiller heat-exchanger is 0° C., and this helps to heat shield any control electronics disposed below and inside an environmental chamber 128. A dry atmosphere 130 is disposed and maintained inside the environmental chamber 128 to prevent and control frosting.

In general, the thermal resistance 108 to the chiller heat-exchanger is preferably sufficient to prevent boiling off a coolant fluid circulating within the chiller heat-exchanger 110 when the heater 120 is operating. The chiller heat-exchanger 110 and external chiller 124 typically circulate a fluid comprising a fluorocarbon, e.g., as marketed by 3M Company.

The temperature control system 116 is a supervisory controller, most likely implemented as a program running on a small single board computer. It may receive instructions from a main probing system-computing controller or directly from a built-in control panel. It issues setpoint values to two temperature controllers, typically via RS-232 interfaces. The controllers control the chiller fluid temperature and the heat-spreader temperature. The temperature controllers may be built into the chiller and heater power supply, as hinted in FIG. 2. The supervisory controller also controls the heat-exchanger positioning. This may be via a motor servo loop, open control system, or perhaps by a less complex control strategy. The movement primarily controls position and does not necessarily directly control temperature. Heater power is generally turned off during cooling.

Figure 2:
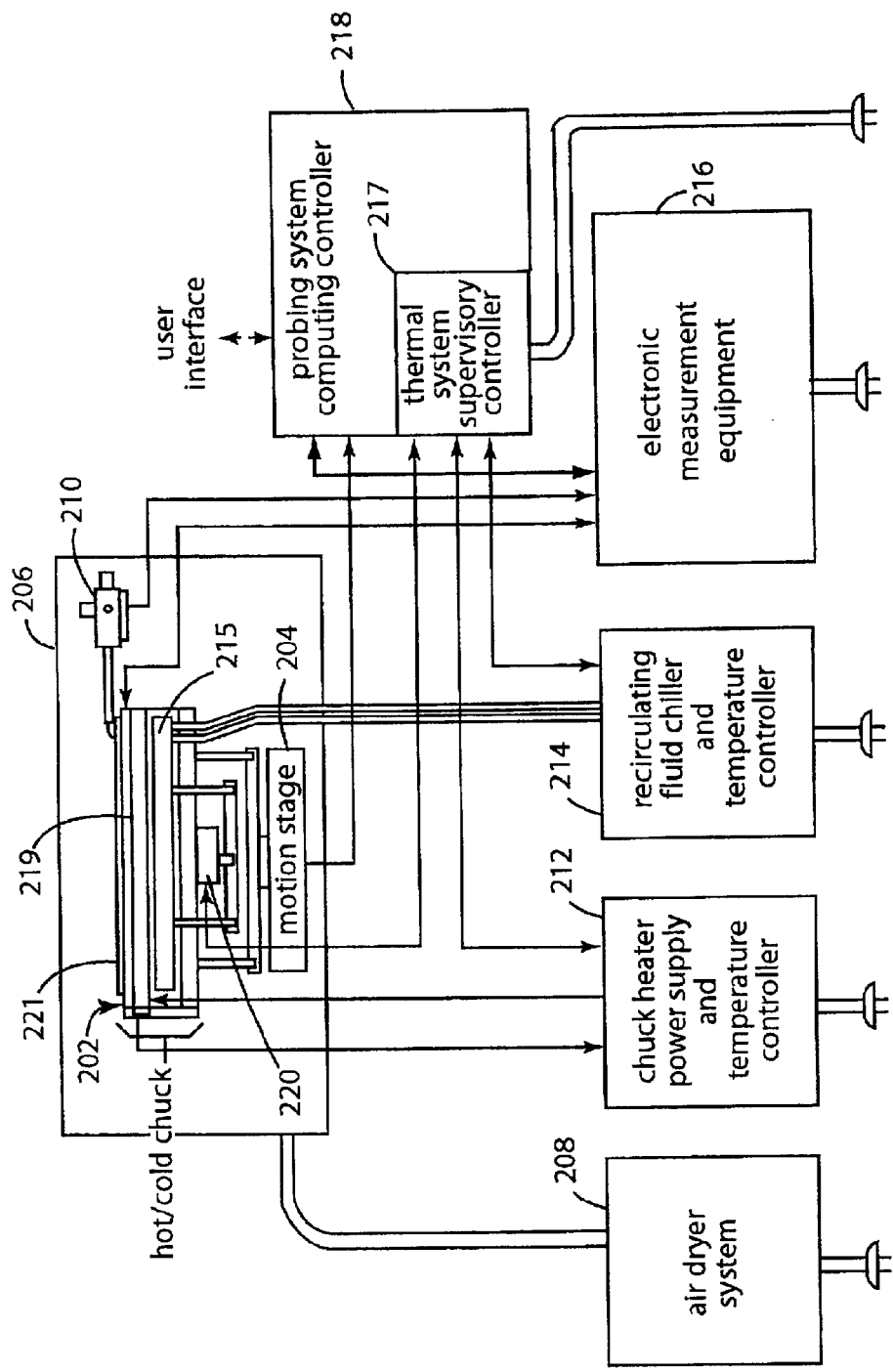
FIG. 2 is a block diagram of a wafer-probing system embodiment of the present invention and includes a hot/cold chuck based on the elements of FIG. 1.

FIG. 2 illustrates a wafer-probing system embodiment of the present invention, and such is referred to herein by the general reference numeral 200. The wafer-probing system 200 includes a hot/cold chuck 202 mounted on a motion stage 204 inside an enclosure 206. An air drier 208 supplies dry air that will not form frost on the components inside enclosure 206. A probe 210 provides for semiconductor wafer testing on the chuck 202. A chuck heater power supply and temperature controller 212 operate on heating cycles, e.g., to +400° C. A recirculating fluid chiller and temperature controller 214 chill a movable cooling heat-exchanger 215 during cooling cycles, e.g., to as low as −80° C. An electronic test instrument 216 may be electrically connected to the probe 210 and the chuck 219 to measure the electrical parameters of the DUT (Device Under Test) 221.

In particular, the thermal system supervisory controller 217 can operate a cooling-heat-exchanger-positioning motor 220 to increase or decrease the effective thermal coupling between the cooling heat-exchanger 215 and the fixed top portion of chuck 202. The probing system computing controller 218 provides direction to and receives data from the instrumentation 216. The thermal systems supervisory controller 217 could be integral to the computing controller 218, but is equally likely to be built into a separate box with a human interface, or a separate box which receives control instructions from the computing controller 218.

Figure 3:
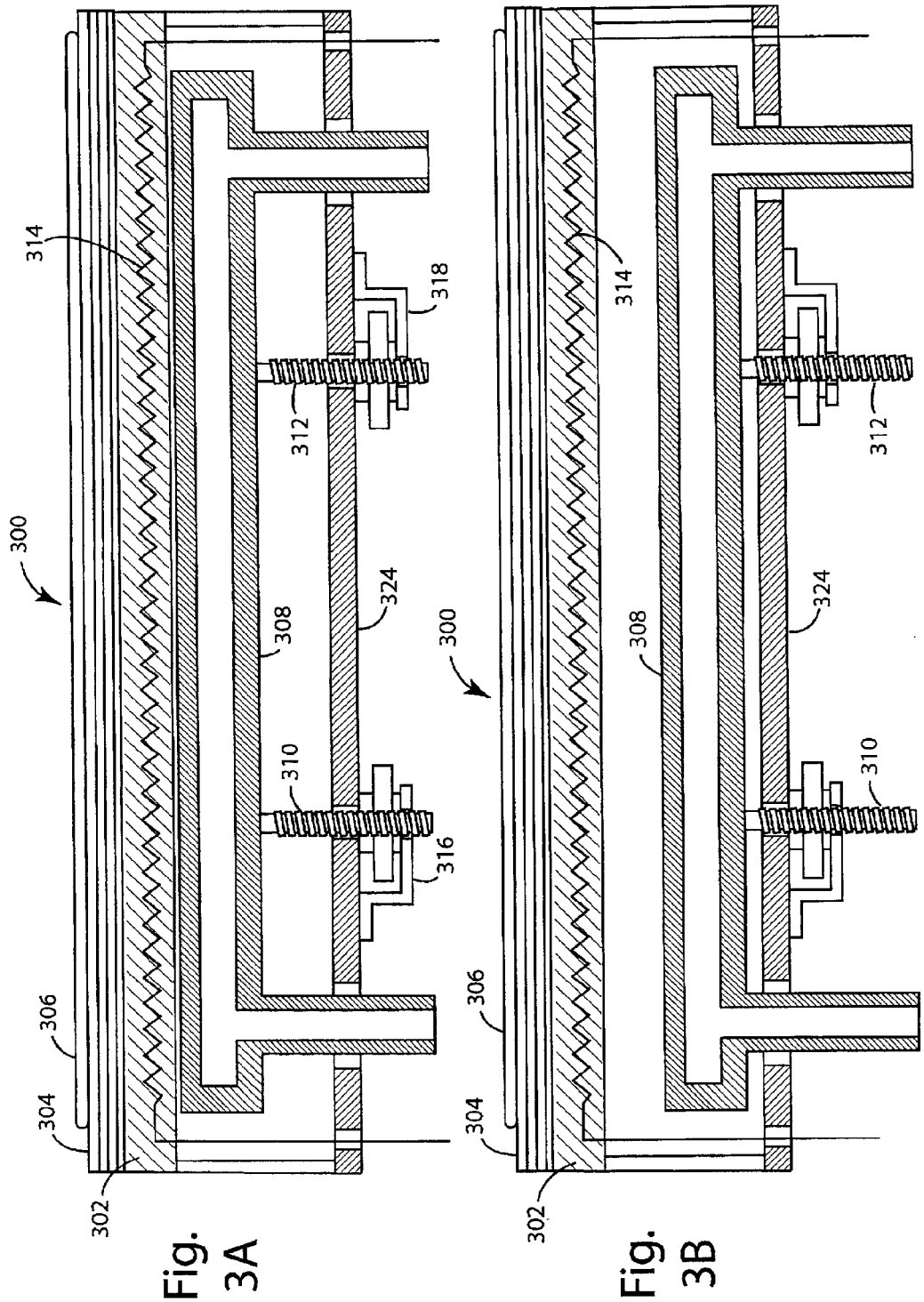
FIGS. 3A and 3B are cross-sectional diagrams of a hot/cold vacuum chuck embodiment of the present invention like that shown in FIG. 2.

FIGS. 3A and 3B represent a hot/cold vacuum chuck embodiment of the present invention like that shown in FIG. 2, and are referred to herein by the general reference numeral 300. One or more additional layers 304 may cover the heat spreader plate 302 to enhance electrical measurement capabilities by reducing noise and leakage currents.

Typically these layers are alternately thin insulator and conducting sheets, which may variously be fabricated as solid plates, metallic foils, and/or deposited films.

The hot/cold vacuum chuck 300 primarily heats or cools the semiconductor wafer 306 to various target temperatures so probing tests and failure analysis can be conducted. FIG. 3A shows how during cooling of the semiconductor wafer 306 a cooling heat-exchanger 308 is lifted by a set of jackscrews 310 and 312 to be in close proximity or contact with the heat spreader 302. An electric heater element 314 is turned off during cooling. A set of motors, or a motor and belt, can be used to run the jackscrews 310 and 312 up and down as needed. Alternatively, a manually driven thumbscrew can be manipulated for the same purpose.

FIG. 3B shows how during heating of the semiconductor wafer 306 the cooling heat-exchanger 308 is dropped down away from the heat spreader 302 by the jackscrews 310 and 312. The electric heater element 314 is turned on during heating. The separation distance between the heat spreader 302 and the cooling heat-exchanger 308 removes a major part of the heat load from the cooling system.

Figure 4:
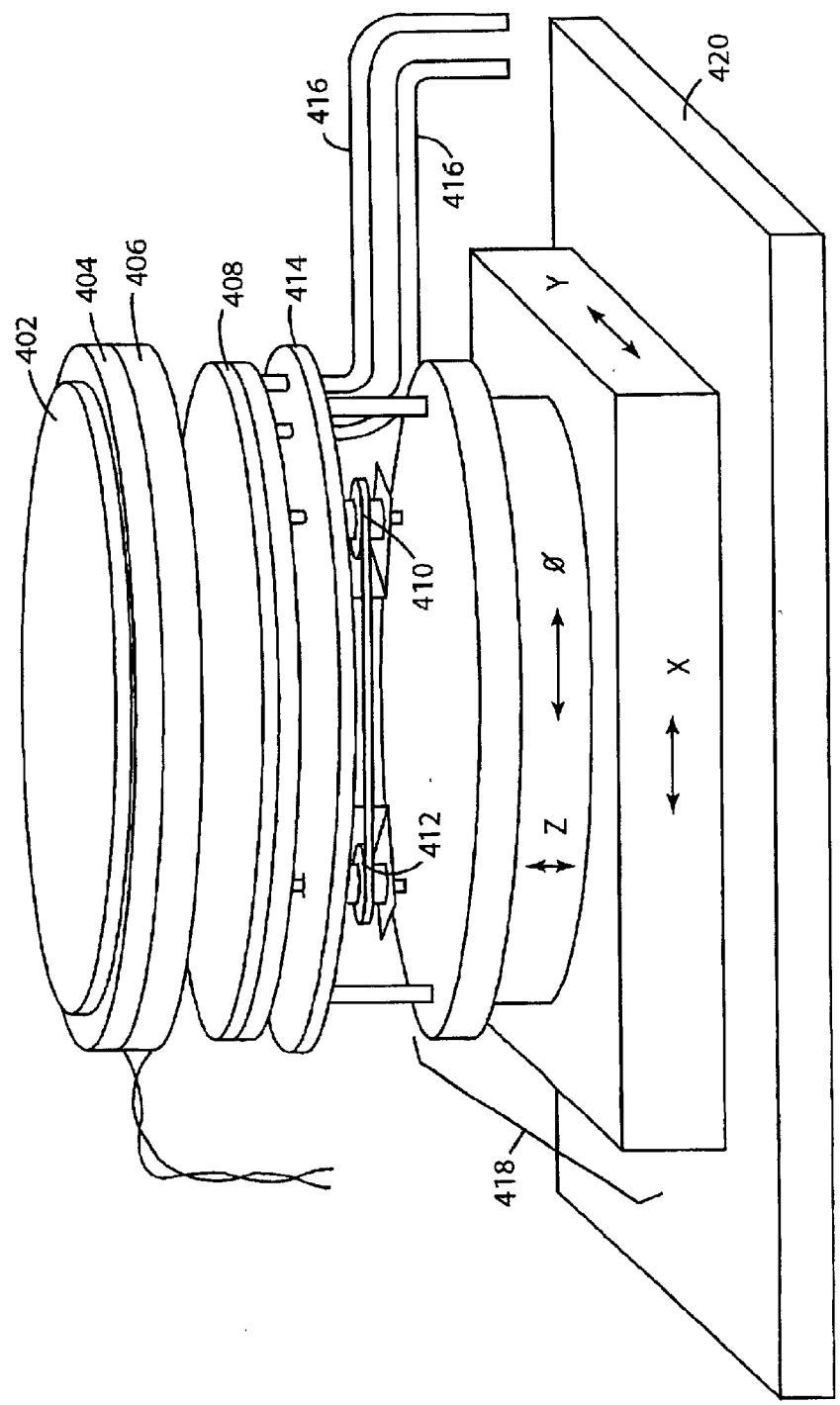
FIG. 4 is a perspective view diagram of a hot/cold vacuum chuck embodiment of the present invention like that shown in FIG. 2 mounted on an X-Y-Z positioning platform to facilitate semiconductor wafer probing.

FIG. 4 is a perspective view diagram of a hot/cold vacuum chuck embodiment of the present invention like that shown in FIG. 2, and is referred to herein by the general reference numeral 400. A semiconductor wafer 402 being tested is placed on the vacuum-clamping surface 404 of a heat spreader 406. The electrical heater is built into the heat spreader 406 that has a fixed position. A moveable cooling plate 408 can be moved up and down by the motion control motor. A base plate 414 supports the above components and is pierced by coolant supply and return piping 416. A positioning stage 418 is mounted on a base foundation 420 and can adjust the X-Y-Z and angular (Ø) position of the semiconductor wafer 402 during probing.

Figure 5:
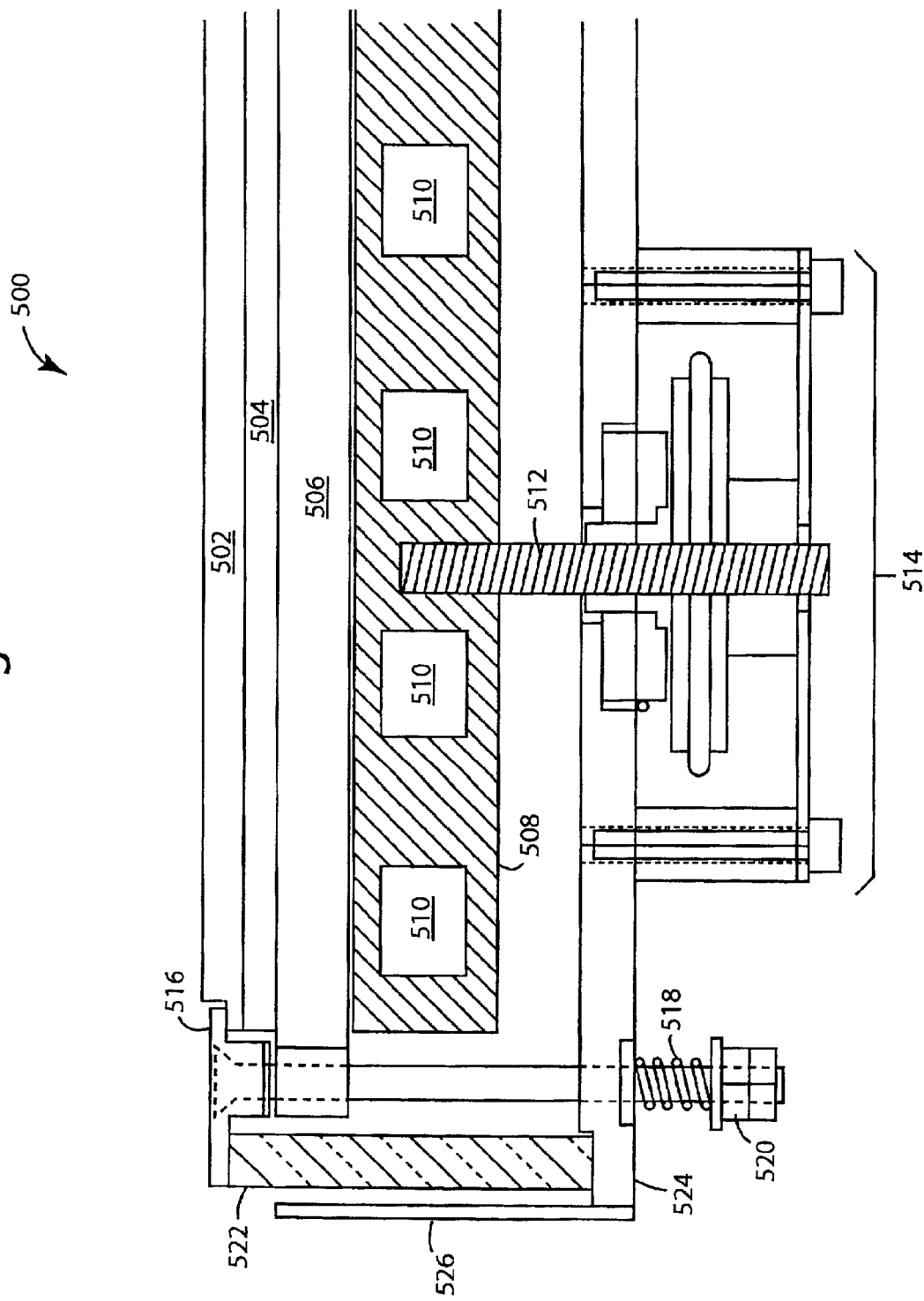
FIG. 5 is a cross-sectional close-up diagram of a hot/cold vacuum chuck embodiment of the present invention like that shown in FIG. 2, and showing some details of the quartz ring supports.

FIG. 5 represents a hot/cold vacuum chuck 500 in a preferred embodiment of the present invention. A sandwich of plates 502 and 504 are clamped to the top of a heat-spreader plate 506. In this embodiment the lower plate 504 may be an insulator, and the upper plate 502 may be a conductor.

A cooling heat-exchanger 508 with coolant chambers 510 is raised and lowered on a jackscrew 512 driven by a positioning motor, e.g., via lift mechanism 514. Such motion will adjust the effective thermal coupling and thermal resistance between the heat-spreader plate 506 and the cooling heat-exchanger 508. A clamping ring 516, a spring 518, and a fastener 520 clamp the edge of an annular, quartz support ring 522 to mount the heat spreader and top plate assembly to the base 524. The support ring 522 has the shape of a straight, parallel section of a hollow right cylinder. For example, it could be cut from a length of large-diameter glass tubing.

The operating range of the hot/cold vacuum chuck 500 can span −80° C. to +400° C., and so the expansion and contraction of these pieces can be substantial. The quartz support ring 522 tolerates such extreme heating and cooling very well, and provides a solid support from a base plate 524. A protective shield 526 surrounds the quartz support ring 522 all around its circular perimeter.

The annular, quartz support ring 522 is a critical component in many embodiments of the present invention. It places a support member with a crucial low-coefficient of thermal expansion at a place that principally defines the plane of the top surface of the work area.

Figure 6:
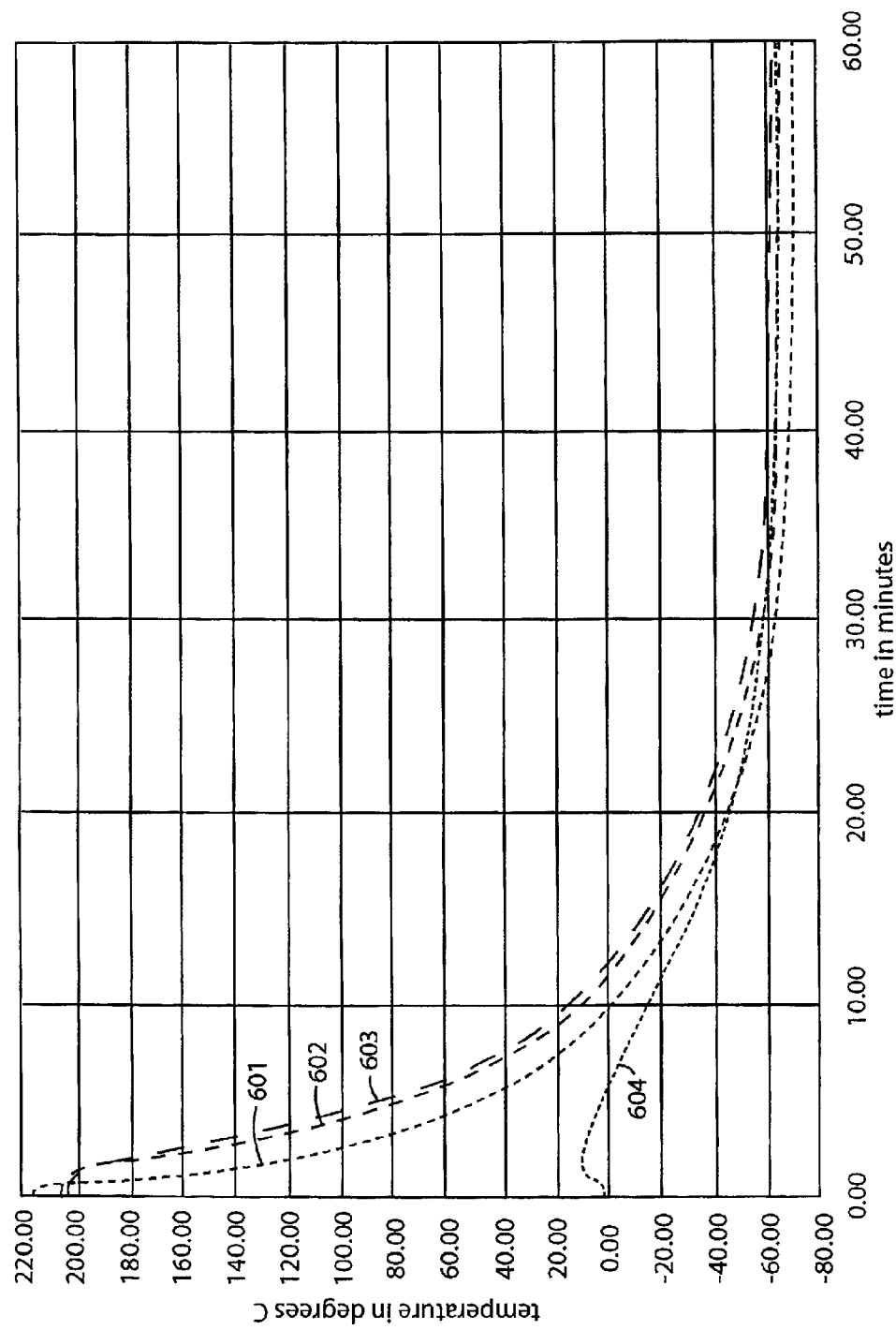
FIG. 6 is a chart showing a cool-down test of a hot/cold vacuum chuck embodiment of the present invention like that shown in FIG. 2.

FIG. 6 is a chart 600 showing a cool-down test of a hot/cold vacuum chuck embodiment of the present invention like that shown in FIG. 2. Three thermocouples were attached to various points on the chuck: a first on a heat spreader (Ts), a second to the top surface of the chuck near the edge (Te), and the third to the top surface of the chuck near the center (Tc). A fourth thermocouple was attached to a chiller heat-exchanger. These respectively produced temperature curves 601–604. At time zero, e.g., 0.00 minutes, the device-under-test was stabilized at over 200° C. and the cooling heat-exchanger was idling at 0° C. In the first minute, the heater was turned off, the chiller reactivated, and the cooling plate moved in to thermally couple with the heat-spreader and device-under-test. This caused a small bump in curve 604, but not so high as to evaporate the coolant or cause it to decompose into potentially non-benign constituents. The curves 601–603 drop precipitously, and demonstrate good performance. The surface of the spreader plate was stabilized at less than −60° C. in less than forty minutes. Faster speeds are possible.

Figure 7:
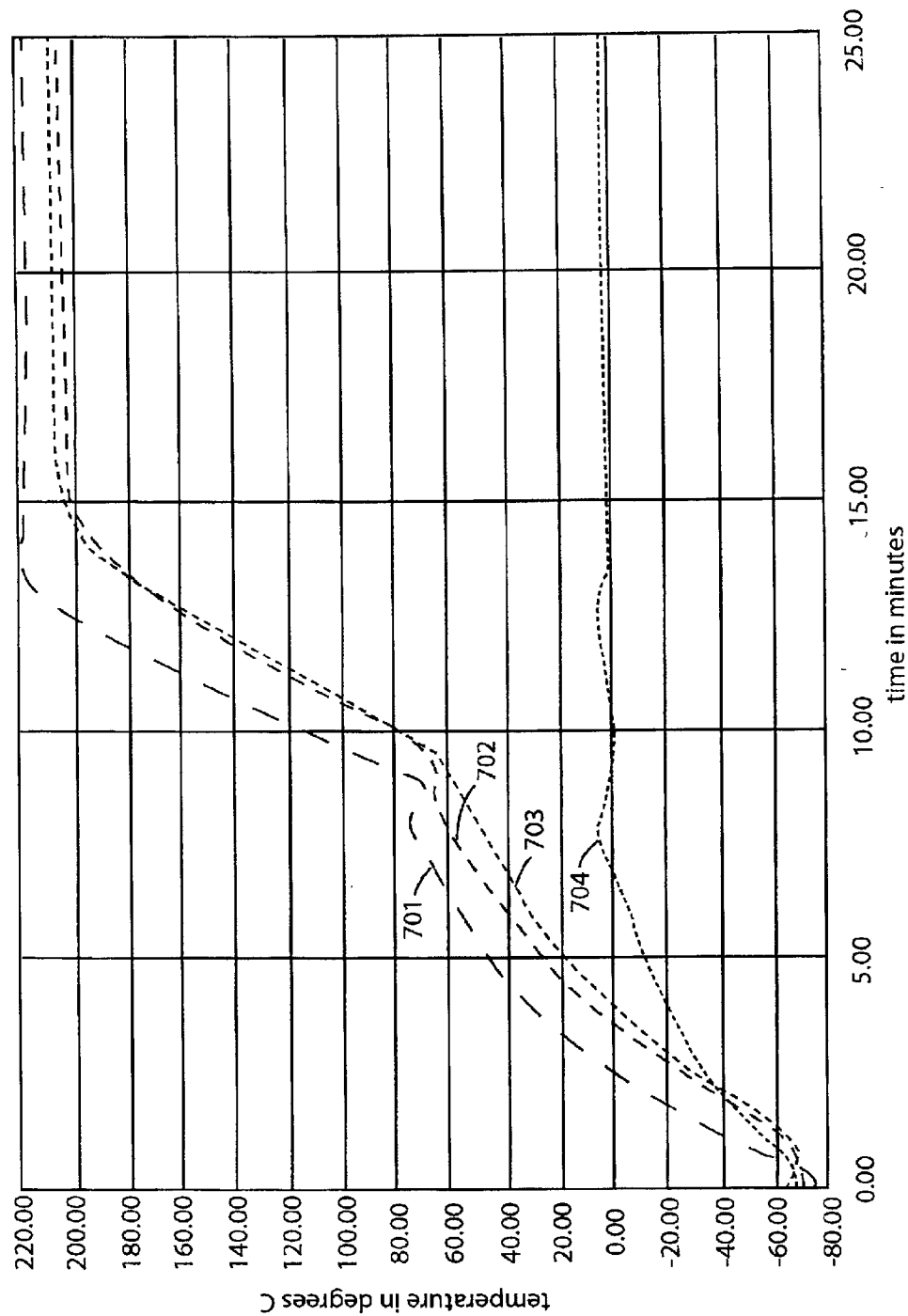
FIG. 7 is a chart showing a heat-up test of a hot/cold vacuum chuck embodiment of the present invention like that shown in FIG. 2.

FIG. 7 is a chart 700 showing an actual heat-up test of the hot/cold vacuum chuck mentioned in connection with FIG. 6. which starts from an extremely cold temperature. The thermocouples attached to various points respectively produced temperature curves 701–704. The heater was inadvertently shut off in the 8–9 minute period. The graph is nevertheless informative.

At time zero, e.g., 0.00 minutes, the device-under-test was stabilized at under −60° C. and the cooling heat-exchanger was running at maximum. In the first minute, the heater was turned on and the chiller set to 0° C., but the cooling plate remained in contact with the heat spreader. At 7 minutes the cooling heat-exchanger was positioned far away from the heat spreader. This allowed the temperatures to rapidly separate, e.g., as seen in the diversion of curves 701–703 from curve 704. The curves 701–703 plateau above +200° C. in under fifteen minutes.

A preferred system embodiment of the present invention uses two temperature controllers, and one chiller heat-exchanger positioner. One temperature controller controls the electric heater plate, and the other controls the chiller fluid temperature, for example, controllers 212 and 214, A third controller controls the positioning motor 220 (FIG. 2). These three controllers and positioners are, in turn, connected to a master controller, e.g., the thermal systems supervisory controller 217 (FIG. 2). Alternately, such supervisory controller could be realized in software within the probing system computing controller 218.

Lesser-preferred embodiments of the present invention allow the heating and cooling systems to battle one another. For instance, where the heater is left on and the chiller heat-exchanger position is moved in and out to hold a desired device-under-test temperature. Typically this method would be inefficient, but may have other advantages such as faster response time or enhanced temperature accuracy.

Therefore, a preferred operating-method embodiment of the present invention begins by heating a device-under-test chuck from near room temperature. To do this without causing a battle with the cooling system, the chiller's heat-exchanger is lowered away to open up a large insulating gap. The chiller-fluid temperature controller is reset to a moderate temperature setpoint, e.g., 0–25° C. The electric-heat controller is used to proportionally control heater-power to maintain the desired hot temperature setpoint.

The device-under-test is cycled cold by idling electric-heat controller, i.e., to essentially turn off the heater filaments. The fluid temperature of the chiller system is brought near to the desired cold temperature by issuing a setpoint-value to the chiller-fluid controller. Then the chiller's heat-exchanger is moved close enough to the heater plate to instigate rapid cooling, but not close enough to overheat the chiller fluid or induce plate warping. In less extreme temperature ramping, such chiller fluid boiling and plate warping will not be an issue. So when it is "safe", the chiller heat-exchanger can be raised to actually contact the heater plate. The chiller-fluid controller then operates to further reduce the device-under-test chuck temperature to the cold setpoint-value.

The device-under-test chuck temperature is brought up from cold temperatures by first sending the chiller chiller-fluid controller a setpoint-value near room temperature, e.g., 0° to 25° C. The desired hot setpoint-value is sent to the electric-heat controller, and heating commences. The chiller heat-exchanger contact with the heater plate is preferably maintained until the chiller fluid temperature comes up to the desired fluid idle temperature. The chiller heat-exchanger is then moved away to its maximum separation position. Such frees the electric-heat controller to more rapidly drive chuck temperature up to the hot setpoint-value.

In many of the lift and pulley mechanisms illustrated, the center through-hole of a wheel is threaded to mate with a jackscrew that passes through it and is fixedly attached to the chiller heat exchanger. Each wheel is captured between the base plate (e.g., 324) and a support bracket (e.g. 318). When the wheel is turned, the jackscrew and the attached chiller heat-exchanger move up and down. Three sets of jackscrews and wheels are normally used to define and retain chiller heat-exchanger and spreader surfaces in parallel planes. The threaded jackscrew drive wheels are simultaneously driven by a common belt or chain and motor, e.g., as can be partially seen in FIG. 4.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A semiconductor-wafer tester, comprising:
   a heat-spreader plate providing a clamping surface for a semiconductor wafer;
   a heater disposed within the heat-spreader plate and providing for temperature elevations;
   a chiller heat-exchanger mobile and independent of the heat-spreader plate and providing for heat removal;
   a continuously variable-width gap separating the chiller heat-exchanger in relation to the heat-spreader plate providing for continuous thermal resistance and coupling adjustments of heat sinking out of said semiconductor wafer; and
   a position control system connected to adjust the continuously variable-width gap.

2. The semiconductor-wafer tester of claim 1, wherein:
   the heater comprises electric heating elements that can be power controlled including full on or off; and
   the chiller heat-exchanger is moved sufficiently far enough away to prevent boiling and evaporation of a coolant disposed inside when the heater is under power.

3. The semiconductor-wafer tester of claim 1, further comprising:
   a device-under-test-temperature controller with electrical outputs connected to the heater and connected to the position control system, and having an input for sensing the temperature of a device-under-test clamped to the heat-spreader plate, and further providing for the control of said temperature by controlling the heater power and by moving the chiller heat-exchanger in relation to the heat-spreader plate.

4. The semiconductor-wafer tester of claim 3, further comprising:
   a limiter disposed in the device-under-test-temperature controller for limiting the movement of the chiller heat-exchanger in relation to the heat-spreader plate according to a maximum supportable heat load.

5. The semiconductor-wafer tester of claim 1, further comprising:
   a vacuum for clamping said semiconductor wafer to said clamping surface; and
   an external chiller connected to circulate coolant to the chiller heat-exchanger.

6. A means for heating and cooling a device-under-test, the method comprising the steps of:
   means for providing a heat-spreader plate with a clamping surface for a device-under-test;
   variable separation-gap positioning means for continuous adjustment between a minimum and a maximum of a thermal resistance from said heat-spreader plate to a chiller heat-exchanger;
   means for heating said heat-spreader plate by incrementally increasing said thermal resistance from it to a chiller heat-exchanger; and
   means for cooling said heat-spreader plate by incrementally decreasing said thermal resistance from it to said chiller heat-exchanger.

7. The means of claim 6, wherein:
   the means for heating is such that an increase in said thermal resistance to said chiller heat-exchanger is sufficient to prevent boiling of a coolant fluid circulating within said chiller heat-exchanger.

8. The means of claim 6, wherein:
   the means for heating is such that said chiller heat-exchanger is maintained at an idle temperature.

9. The means of claim 6, wherein:
   the means for cooling further includes using a chiller heat-exchanger in which is circulated a fluid comprising a fluorocarbon.

10. The means of claim 6, further comprising:
    means for limiting any heat loading of a chiller circulating a coolant to said chiller heat-exchanger by controlling a change in said thermal resistance.

11. The means of claim 6, further comprising:
    means for measuring the temperature of said heat-spreader plate; and
    means for controlling said thermal resistance to maintain a setpoint temperature according to information obtained in the step of measuring.

\* \* \* \* \*